United States Patent
Chen et al.

(10) Patent No.: US 9,768,051 B2
(45) Date of Patent: Sep. 19, 2017

(54) WAFER CLAMPING APPARATUS

(71) Applicant: SAMSUNG ELECTRONICS CO., LTD., Suwon-si, Gyeonggi-do (KR)

(72) Inventors: Xinglong Chen, Seongnam-si (KR); Dali Liu, Yongin-si (KR); Sung-Ho Jang, Suwon-si (KR); Yong-Ho Lim, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/071,228

(22) Filed: Mar. 16, 2016

(65) Prior Publication Data
US 2017/0018451 A1    Jan. 19, 2017

(30) Foreign Application Priority Data
Jul. 17, 2015 (KR) .......................... 10-2015-0101519

(51) Int. Cl.
 H01L 21/687 (2006.01)
(52) U.S. Cl.
 CPC ............... H01L 21/68728 (2013.01)
(58) Field of Classification Search
 CPC ......... H01L 21/68721; H01L 21/68735; A47B 27/00; B21D 43/003; B21D 43/10; B23K 3/087; B23K 2201/42
 USPC ................. 269/111, 254 CS, 289 R
 See application file for complete search history.

(56) References Cited

U.S. PATENT DOCUMENTS

| 3,423,082 | A | * | 1/1969 | Reyner | B25B 5/142 |
| | | | | | 269/104 |
| 4,821,393 | A | * | 4/1989 | Spigarelli | B23Q 3/183 |
| | | | | | 269/224 |
| 5,326,725 | A | * | 7/1994 | Sherstinsky | C23C 16/042 |
| | | | | | 118/500 |
| 5,605,574 | A | * | 2/1997 | Tsunashima | C23C 16/4583 |
| | | | | | 118/500 |
| 5,679,168 | A | | 10/1997 | Porter et al. | |
| 5,820,685 | A | * | 10/1998 | Kurihara | C23C 16/4583 |
| | | | | | 118/715 |
| 6,062,852 | A | * | 5/2000 | Kawamoto | H01L 21/67109 |
| | | | | | 392/418 |
| 6,162,336 | A | * | 12/2000 | Lee | C23C 14/50 |
| | | | | | 118/500 |
| 6,299,153 | B1 | * | 10/2001 | Meron | H01L 21/68728 |
| | | | | | 269/128 |
| 6,497,403 | B2 | * | 12/2002 | Ries | H01L 21/6875 |
| | | | | | 269/20 |
| 6,783,299 | B2 | | 8/2004 | Meron et al. | |
| 8,186,661 | B2 | | 5/2012 | Pitney et al. | |

(Continued)

FOREIGN PATENT DOCUMENTS

| DE | EP 0989594 A2 * | 3/2000 | ......... H01L 21/6715 |
| JP | 2003-332408 A | 11/2003 | |

(Continued)

*Primary Examiner* — George Nguyen
(74) *Attorney, Agent, or Firm* — Lee & Morse P.C.

(57) ABSTRACT

A wafer clamping apparatus, including a plurality of support pins under a wafer, the plurality of pins to support the wafer; and a side clamp at a lateral side of the wafer, the side clamp to directly contact a lateral side of the wafer to press the wafer, the side clamp to press the wafer in a first direction or a second direction, the first direction and the second direction being different directions.

18 Claims, 17 Drawing Sheets

(56) References Cited

U.S. PATENT DOCUMENTS

| | | |
|---|---|---|
| 2004/0053147 A1* | 3/2004 | Ito .................. G03F 7/3021 430/30 |
| 2004/0178553 A1 | 9/2004 | Camm et al. |
| 2006/0174836 A1 | 8/2006 | Lee et al. |
| 2011/0024962 A1* | 2/2011 | Zhang .................. B25B 5/06 269/107 |
| 2012/0227666 A1* | 9/2012 | Kim .................. C23C 16/458 118/723 R |
| 2014/0169772 A1 | 6/2014 | Abe et al. |
| 2014/0349466 A1 | 11/2014 | Ho et al. |

FOREIGN PATENT DOCUMENTS

| | | | | |
|---|---|---|---|---|
| JP | 2004-221134 A | | 8/2004 | |
| JP | 2005-45005 | * | 2/2005 | ........... H01L 21/304 |
| JP | 2005-057047 A | | 3/2005 | |
| KR | 10-2006-0005452 A | | 1/2006 | |
| KR | 10-2008-0069557 A | | 7/2008 | |

* cited by examiner

13

WAFER CLAMPING APPARATUS

CROSS-REFERENCE TO RELATED APPLICATION

Korean Patent Application No. 10-2015-0101519, filed on Jul. 17, 2015, in the Korean Intellectual Property Office, and entitled: "Wafer Clamping Apparatus," is incorporated by reference herein in its entirety.

BACKGROUND

1. Field

Embodiments relate to a wafer clamping apparatus.

2. Description of the Related Art

A semiconductor device may be manufactured by selectively and repeatedly performing various processes such as photolithography, etching, ion implantation, diffusion, metal deposition, polishing, and cleaning, to laminate a plurality of circuit patterns on a wafer.

SUMMARY

Embodiments may be realized by providing a wafer clamping apparatus, including a plurality of support pins under a wafer, the plurality of pins to support the wafer; and a side clamp at a lateral side of the wafer, the side clamp to directly contact a lateral side of the wafer to press the wafer, the side clamp to press the wafer in a first direction or a second direction, the first direction and the second direction being different directions.

The wafer clamping apparatus may further include a side clamping elastic body connected with the side clamp, the side clamping elastic body to provide an elastic force to the side clamp.

The side clamp may include a contact portion and a projecting portion, the contact portion may contact the lateral side of the wafer, and the projection portion may not contact the lateral side of the wafer.

The projecting portion may overlap the upper surface of the wafer.

The projecting portion may contact the contact portion.

The side clamp may further include a connecting portion connecting the contact portion and the projecting portion.

The connecting portion may be inclined at a first angle with respect to the contact portion, and the projecting portion may be inclined at a second angle with respect to the contact portion, the second angle being different from the first angle.

The first direction may be a direction from the side clamp to the wafer, and the second direction may be a direction perpendicular to the first direction.

The first direction may be a direction from the wafer to one of the support pins, and the second direction may be a direction opposite from the first direction.

The wafer clamping apparatus may include a plurality of side clamps.

The wafer clamping apparatus may include four side clamps. Each of the four side clamps may be on an axis of a Cartesian coordinate system.

Positions of the plurality of support pins may correspond to positions of the side clamps.

Embodiments may be realized by providing process equipment, including a chamber to accommodate a wafer; a plate under the wafer, the plate having a shape of a plane; a support pin on the plate to support the wafer; a side clamp at a lateral side of the wafer, the side clamp to directly contact a lateral side of the wafer to press the wafer; and a side clamping elastic body connected with the side clamp, the side clamping elastic body to provide an elastic force to the side clamp.

The side clamp may press the wafer in a first direction or a second direction, and the first direction and the second direction may be different directions.

The side clamp may include a contact portion and a projecting portion, the contact portion may contact the lateral side of the wafer, and the projection portion may not contact the lateral side of the wafer.

Embodiments may be realized by providing a wafer clamping apparatus, including a side clamp at a lateral side of a wafer, the side clamp to directly contact the lateral side of the wafer, a side clamping elastic body connected with the side clamp, the side clamp and the side clamping elastic body to absorb movement energy of the wafer.

The movement energy of the wafer may result from the wafer having received high thermal energy.

The movement energy of the wafer may be vibration in a direction of the side clamp.

Absorption of the movement energy of the wafer may prevent destruction of the wafer due to its own bending stress.

Embodiments may be realized by providing process equipment, including the presently disclosed wafer clamping apparatus. Absorption of the movement energy of the wafer may prevent damage of the wafer due to a secondary collision with an internal structure of the process equipment.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
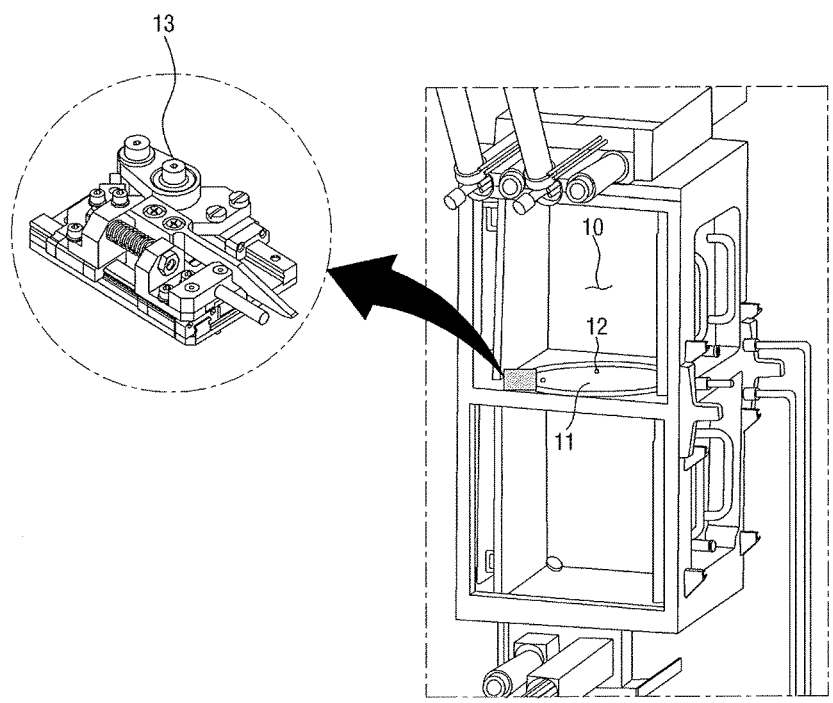
FIG. 1 illustrates a perspective view of high-speed annealing process equipment.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of features may be exaggerated for clarity of illustration. Like reference numerals refer to like elements throughout.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of skill in the art. It is noted that the use of any and all examples, or exemplary terms provided herein is intended merely to better illuminate the embodiments and is not a limitation unless otherwise specified. Further, unless defined otherwise, all terms defined in generally used dictionaries may not be overly interpreted.

Embodiments will be described with reference to perspective views, cross-sectional views, and/or plan views, in which embodiments are shown. Thus, the profile of an exemplary view may be modified according to manufacturing techniques and/or allowances. That is, the embodiments are not intended to be limiting but cover all changes and modifications that can be caused due to a change in manufacturing process. Thus, regions shown in the drawings are illustrated in schematic form and the shapes of the regions are presented simply by way of illustration and not as a limitation.

Hereinafter, embodiments will be described in detail with reference to the attached drawings.

Embodiments may provide a wafer side clamp that may be easily mounted in high-speed annealing equipment in order to minimize the deformation and damage of a wafer due to, for example, thermal energy during a high-speed annealing process.

In the high-speed annealing equipment, a pin may be used to improve the heat transfer efficiency and uniformity of a wafer by supporting the wafer. However, the pin may be locally brought into contact with the moved and deformed wafer to concentrate impact energy, and damage to the wafer in the high-speed annealing process may be caused. The damage to the wafer may cause serious secondary damage such as damage to the equipment, as well as may cause direct loss.

Comparative annealing equipment may prevent the chemical interaction between a clamp and a wafer, whereas the annealing equipment according to embodiments may support a wafer, effectively fix the wafer, and prevent the damage to the wafer through the absorption of movement (bending, vibration, or jumping) energy. For example, comparative annealing equipment may relate to an apparatus for statically fixing the wafer. In contrast, the annealing equipment according to embodiments may be configured such that the chemical interaction between a clamp and a wafer may occur, the wafer may be supported, the wafer may be effectively fixed, and the damage to the wafer may be prevented through the absorption of movement (bending, vibration, or jumping) energy.

Figure 2:
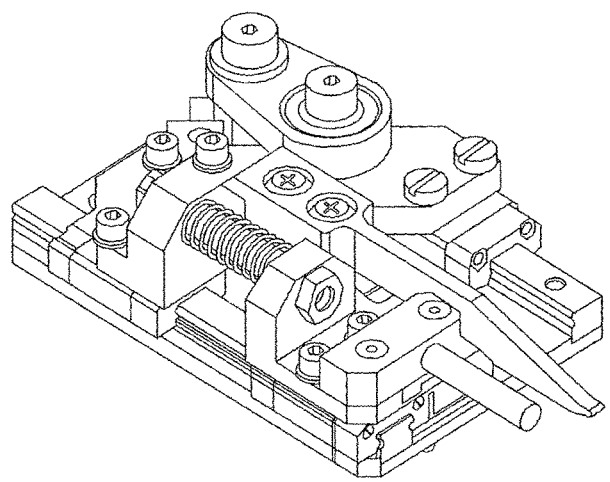
FIG. 2 illustrates a partially enlarged view of FIG. 1.

FIGS. 1 and 2 illustrate high-speed annealing equipment. FIG. 1 illustrates a perspective view of the high-speed annealing equipment, and FIG. 2 illustrates a partially enlarged view of FIG. 1.

Referring to FIGS. 1 and 2, the high-speed annealing equipment may include a chamber 10, a plane plate 11, a support pin 12, and a wafer lifting clamp 13.

The chamber 10 may be a space for accommodating a wafer (W). For example, as the chamber 10, a plurality of chambers may be formed. The wafer (W) may be transferred into the chamber 10 using a wafer transfer apparatus.

The plane plate 11 may be a lower surface defining the chamber 10, and may be a plane-shaped plate disposed under the wafer (W). The plane plate 11 may be used for protecting the lower portion of the wafer (W) in order to prevent the warpage of the wafer (W). The plane plate 11 may be made of synthetic quartz.

The support pin 12 may be formed on the plane plate 11, and may serve to support the wafer (W). The support 12 may not serve to absorb the movement energy of the wafer (W) or minimize the absorption of the movement energy thereof, and may be a cause of damage to the wafer (W). The support pin may be made of a metal or quartz.

The wafer lifting clamp 13 may serve to assist a wafer arm, and may be used for positioning the center of the wafer (W). The wafer lifting clamp 13 may be made of aluminum or quartz.

Figure 3:
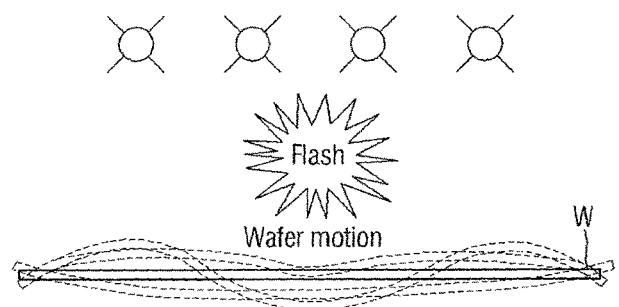
FIG. 3 illustrates a schematic view of the form of deformation of a wafer.

FIG. 3 schematically illustrates the form of deformation of a wafer.

Referring to FIG. 3, the wafer (W) may be disposed on the support pin 12 capable of supporting the wafer (W) in the high-speed annealing equipment. According to the structure of the support pin 12 supporting the wafer (W), an apparatus for absorbing the movement energy of the wafer (W) or minimizing the absorption of the movement energy thereof may not be provided during a high-speed annealing process, the deformation or damage of the wafer (W) may occur, the wafer (W) may be damaged, and the high-speed annealing equipment itself may also be damaged.

For example, the wafer (W) having received excessive thermal energy may be deformed due to, for example, the vertical movement thereof on the plane plate 11, and the support pin 12 may make contact with this wafer (W) to cause the concentration of impact energy. The deformation of the wafer (W) may be a major cause for decreasing the number of the obtained wafer chips in accordance with the cleavage of the wafer (W).

Embodiments may improve the number of the obtained wafer chips by reducing the damage to a wafer to prevent the direct loss of the wafer in the high-speed annealing process.

Embodiments may reduce thermal energy by minimizing the movement and deformation of a semiconductor wafer and to maintain the mass production of the semiconductor wafer in the high-speed annealing equipment by reducing the secondary damage of the annealing equipment, for example, by reducing the maintenance and exchange processes required at the time of the annealing equipment being damaged.

Hereinafter, a wafer clamping apparatus according to an embodiment will be described with reference to FIGS. 4 to 11.

Figure 4:
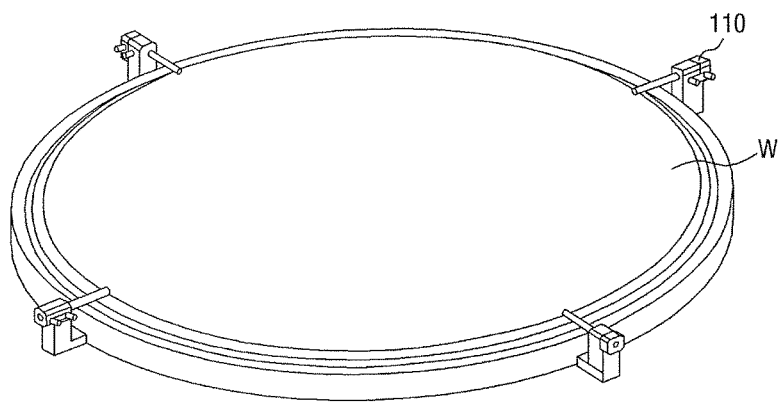
FIG. 4 illustrates a schematic view of a wafer fixed by a wafer clamping apparatus according to an embodiment.
Figure 5:
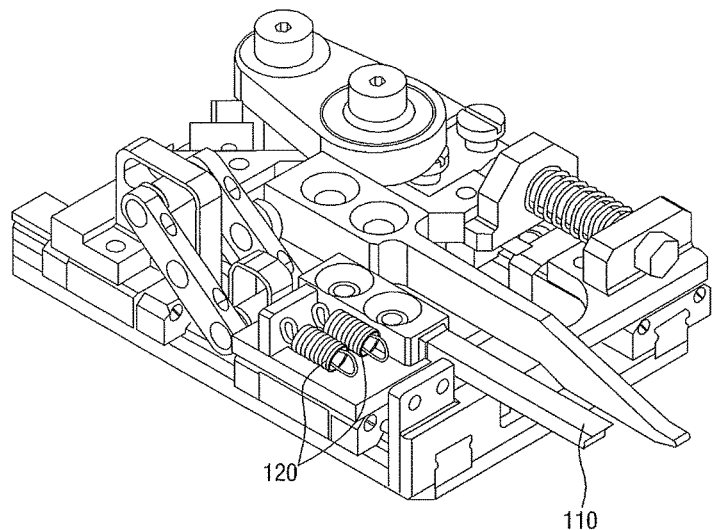
FIG. 5 illustrates a perspective view of a wafer clamping apparatus according to an embodiment.
Figure 6:
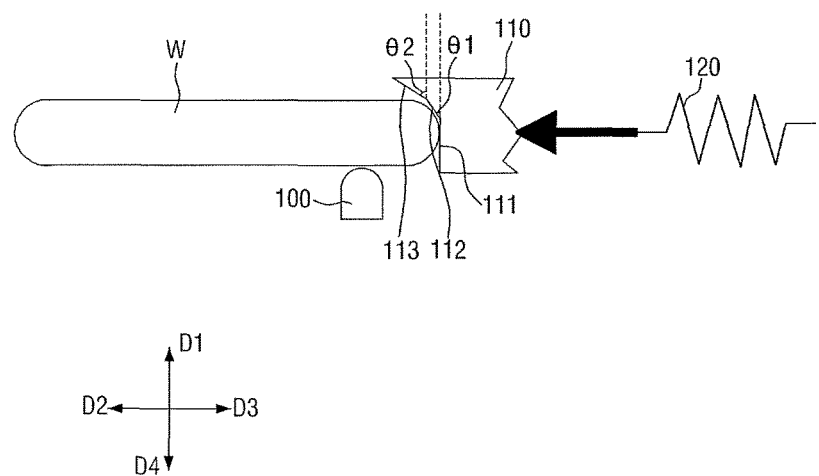
FIG. 6 illustrates a conceptual view of the wafer clamping apparatus according to an embodiment.

FIG. 4 illustrates a schematic view of a wafer fixed by a wafer clamping apparatus according to an embodiment. FIG. 5 illustrates a perspective view of a wafer clamping apparatus according to an embodiment. FIG. 6 illustrates a conceptual view of the wafer clamping apparatus according to an embodiment.

Referring to FIGS. 4 to 6, the wafer clamping apparatus 1 according to an embodiment may include a support pin 100 disposed under the wafer (W) and supporting the wafer (W) and a side clamp 110 disposed at the lateral side of the wafer (W) and making contact with the wafer (W) to press the wafer (W). The wafer (W) may be warped and deformed in the first direction (D1), and the side clamp 110 may press the wafer (W) in the second direction (D2) to prevent the deformation of the wafer (W).

The wafer clamping apparatus 1 may further include a side clamping elastic body 120. The side clamping elastic body 120 may be connected with the side clamp 110, and may provide an elastic force to the side clamp 110 so as to prevent the deformation of the wafer (W).

For example, the wafer clamping apparatus 1 according to embodiments may be formed in order to reduce the contact stress with a structure such as the support pin contacting the wafer (W) in the high-speed annealing process or high-speed flash annealing process. The wafer clamping apparatus 1 may include a side clamp 110 connected with the support pin 100 to minimize the direct contact with the side edge of the wafer (W), and a side clamp elastic body 120 capable of suitably adjusting force intensity and reaction rate.

Referring to FIGS. 4 to 6, there is shown an application example of the side clamp 110 and the side clamping elastic body 120 in the wafer clamping apparatus 1.

In order to effectively operate the structure of the side clamp 110, the support pins 100, the wafer (W), and the side clamps 110 may be arranged in suitable numbers at appropriate positions. The direction of force of the side clamp 110 acting on the wafer (W) may be determined by the side clamp structure (contact angle), and force intensity and reaction rate may be optimized by, for example, a spring, an observer, or an electromagnet.

For example, in order to efficiently absorb the displacement energy while minimizing the displacement of the contacted wafer, force intensity and reaction rate may be optimized, the optimization thereof may be performed by, for example, a spring, an observer, or an electromagnet, and it may be possible to prevent the wafer (W) from being scratched by the contact between the wafer (W) and the side clamp 110.

Referring to FIG. 4, in the wafer clamping apparatus 1 according to embodiments, four support pins and four side clamps 110 may be formed at the positions optimized from the edge of the wafer (W). The support pins under the wafer (W) may be regularly arranged, and the side clamps 110 may be respectively disposed at the positions corresponding to the support pins.

The side clamp 110 according to embodiments may be configured to minimize the direct contact with the side edge of the wafer (W) in order to prevent the motion displacement caused by the thermal deformation of the wafer (W) contacting the support pin and to minimize the contact stress by effectively absorb the energy. The deformation of the wafer (W) may occur in both directions of X axis and Y axis, and the side clamp 110 may also be configured to be linked with the support pin 100 so as to transmit or receive the force in the horizontal direction of the wafer (W) and the force in the vertical direction thereof.

According to embodiments, the force acting between the side clamp 110 and the wafer (W) may be mechanically, aerohydrodynamically, and electrically controlled. The force acting therebetween may be suitably adjusted therethrough.

Hereinafter, the wafer clamping apparatus 1 according to embodiments will be described in detail.

Referring to FIG. 5, the wafer clamping apparatus 1 according to embodiments may include a side clamping elastic body 120, which may be an elastic body for maintaining the contact force of the side clamp 110 with the wafer (W) and absorbing the motion energy of the wafer (W).

The side clamping elastic body 120 may prevent the deformation of the wafer (W) by absorbing or maintaining the movement energy of the wafer (W).

Referring to FIG. 6, the wafer clamping apparatus 1 according to embodiments may include the support pin 100 and the side clamp 110. For example, the side clamping elastic body 120 may be connected to the side clamp 110.

For example, the support pin 100 supporting the wafer (W) may be disposed under the wafer (W), and the side clamp 110 contacting and pressing the wafer (W) may be disposed on the lateral side of the wafer (W). For example, a plurality of the support pins 100 and a plurality of side clamps 110 may be formed, and the number thereof may be suitably adjusted.

The side clamp 110 may include a contact portion 111 and a projecting portion 113. The contact portion 111 may make contact with the lateral side of the wafer (W), and the projecting portion 113 may not make contact with the lateral side of the wafer (W). The projecting portion 113 may be formed to overlap the upper surface of the wafer (W).

The projecting portion 113 may be formed to be inclined to the contact portion 111, and may further include a connecting portion 112 connecting the contact portion 111 and the projecting portion 113. The connecting portion 112 may be formed to be inclined at the first angle ($\theta 1$) to the contact portion 111, and the projecting portion 113 may be formed to be inclined at the second angle ($\theta 2$) to the contact portion 111.

The side clamp 110 may prevent the movement displacement of the wafer (W) moved or vibrated at high speed by the transfer of critical thermal energy to the wafer (W) in the high-speed flash annealing process, and effectively absorb the energy, and the contact stress may be minimized.

For example, four side clamps 110 may be formed, and the four side clamps may be respectively disposed on the axes of Cartesian coordinates, e.g., on the axes of a Cartesian coordinate system. The support pins 100 under the wafer (W) may be regularly arranged at the positions optimized from the edge of wafer (W). When four support pins 100 are formed, the four support pins 100 may be respectively disposed at the positions corresponding to the side clamps 110.

FIGS. 7 to 11 are views for explaining the operation of the wafer clamping apparatus according to an embodiment.

As shown in FIGS. 7 to 11, according to embodiments, the support pin 100 supporting the wafer (W), the side clamp 110 disposed to minimize the friction with the lateral side and upper side of the wafer (W), and the side clamping elastic body 120 may interact with each other to be able to optimally absorb the movement energy of the wafer (W generated by the thermal energy transferred to the wafer (W).

The wafer (W) having received excessive thermal energy in the high-speed annealing process may perform a movement such as, for example, vibration or jumping, the wafer (W) may be damaged, the movement of the wafer (W) may not be supported, and a phenomenon of the wafer (W) being deformed or broken may be caused.

In order to prevent such a phenomenon, a spring for maintaining the contact force of the wafer (W) and absorbing the motion energy of the wafer (W) may be disposed next to the side clamp 110 to effectively absorb and maintain the movement energy of the wafer (W).

Figure 7:
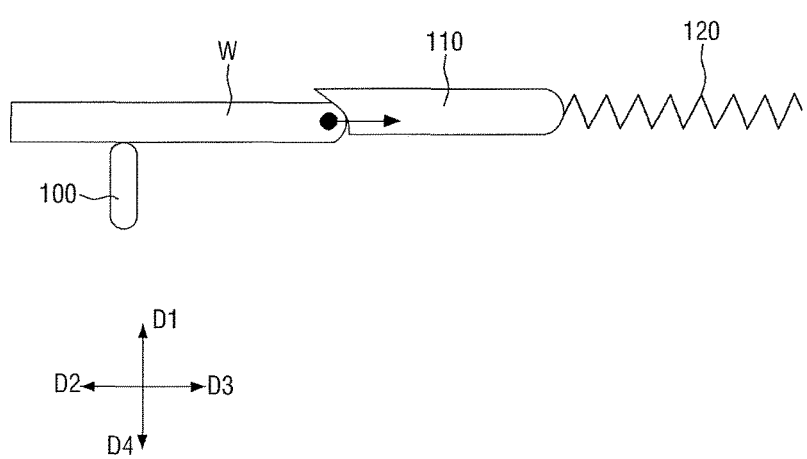
FIGS. 7 to 11 illustrate views for explaining the operation of the wafer clamping apparatus according to an embodiment.
Figure 9:
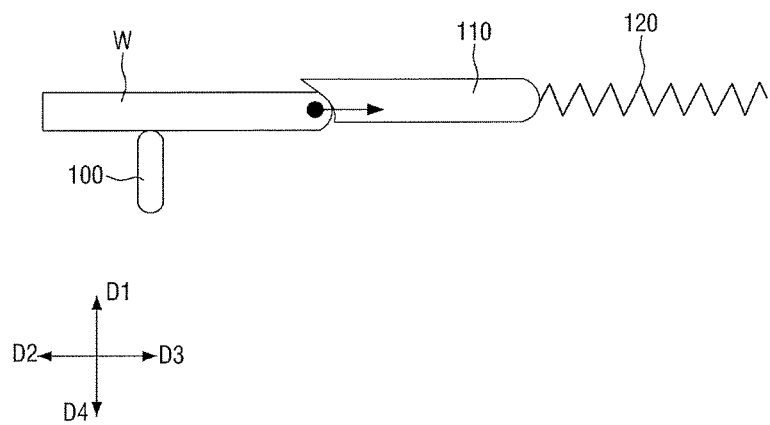

Referring to FIG. 9, in a state in which the wafer (W) does not receive critical thermal energy, the wafer (W), the side clamp 110, and the side clamping elastic body 120 may not move. Referring to FIG. 7, the wafer (W) instantaneously having received high thermal energy may be vibrated in the direction (D3) of the side clamp 110, and, referring to FIG. 11, the wafer (W) may be moved in the opposite direction (D2) of the side clamp 110. The side clamp 110 according to embodiments may effectively interact with the wafer (W) to allow the side clamp 110 and the side clamping elastic body 120 to absorb the movement energy of the wafer (W), and it may be possible to prevent the destruction of the wafer (W) due to, for example, its own bending stress, and to prevent the damage of the wafer (W) due to, for example, the secondary collision with an internal structure.

The side clamp 110 may be pushed toward the side clamping elastic body 120 by the weight of the wafer (W) to absorb impact, and the side clamping elastic body may be contracted to have a resilient restoring force. The side clamp 110 may make point-contact with the lateral surface of the wafer (W), and such a point-contact state may be maintained by the resilient restoring force of the side clamping elastic body.

Referring to FIG. 9, the movement energy of the wafer (W) may be effectively absorbed by the side clamp 110 and the side clamping elastic body (spring) 120 to prevent the unnecessary movement of the wafer (W). The combination of the support pin 100 and the side clamp 110 may effectively hold the wafer (W) in movement.

Figure 8:
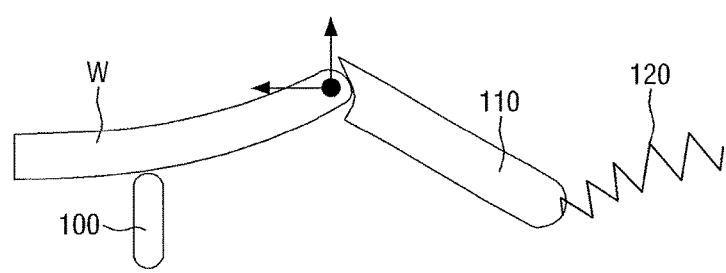
Figure 8:
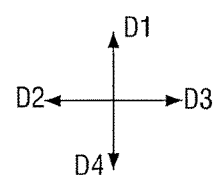
Figure 10:
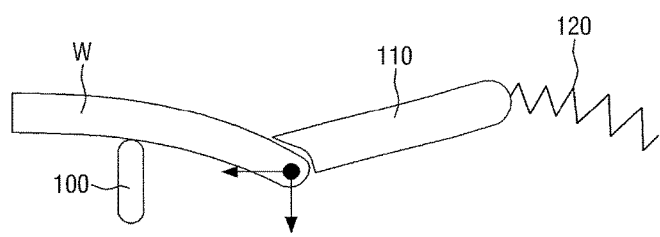
Figure 10:
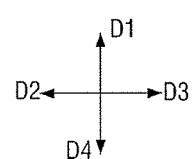
Figure 11:
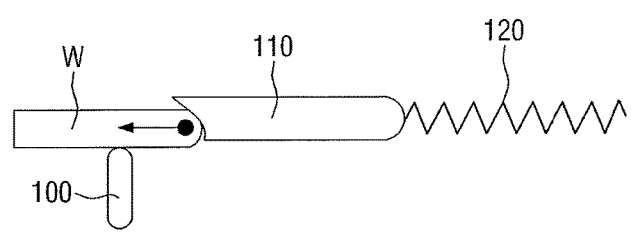
Figure 11:
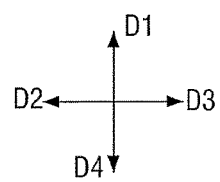

Referring to FIGS. 8 and 10, the movement of the wafer (W) may be performed by jumping or vibration. This movement of the wafer (W) may cause vertical deformation as well as horizontal deformation. The side clamp 110 may be configured to correspond to the vertical deformation of the wafer (W).

Finally, at the edge of the wafer (W), the support pin 100 and the side clamp 110 may be operated each independently, and may also be operated in a combination thereof. The support pin 100 and the side clamp 110 may be configured to correspond to both the horizontal deformation (expansion and contraction) of the wafer (W) and the vertical deformation (bending and warpage) of the wafer (W).

Hereinafter, wafer clamping apparatuses according to embodiments will be described.

Figure 12:
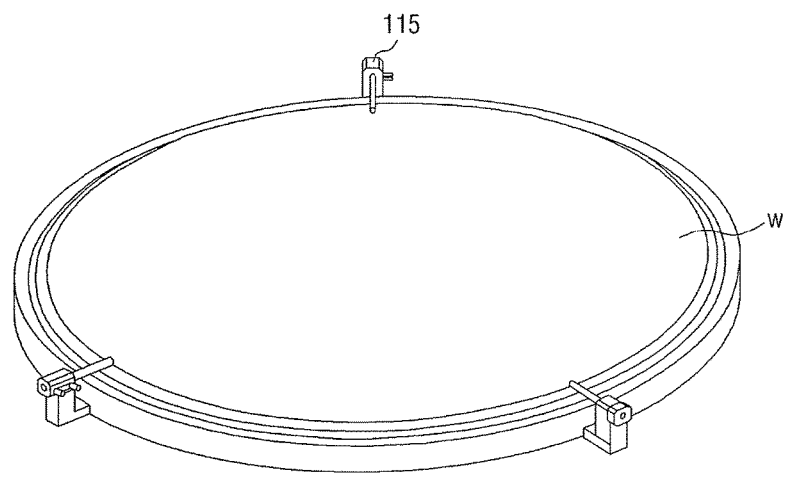
FIG. 12 illustrates a perspective view of a wafer clamping apparatus according to an embodiment.

FIG. 12 illustrates a wafer clamping apparatus according to an embodiment. For convenience of explanation, descriptions of substantially the same components as those described in the wafer clamping apparatus according to an embodiment will be omitted.

Referring to FIG. 12, the wafer clamping apparatus 2 according to an embodiment may include three side clamps 115.

The number of side clamps 115 may be suitably adjusted. In order to reduce costs, three side clamps may be formed. When three side clamps 115 are formed, the masking area of the wafer (W) may be reduced in the high-speed annealing process, compared to when four side clamps 115 are formed.

Figure 13:
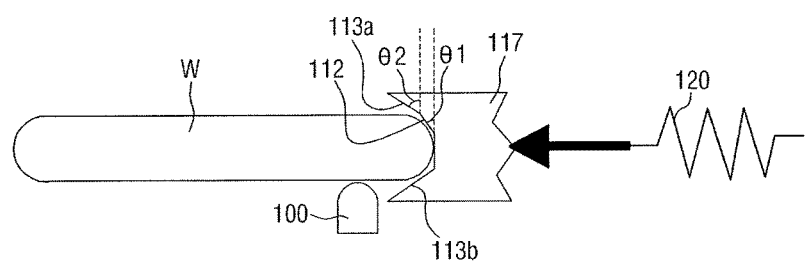
FIG. 13 illustrates a conceptual view of a wafer clamping apparatus according to an embodiment.
Figure 13:
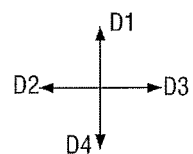

FIG. 13 illustrates a conceptual view of a wafer clamping apparatus according to an embodiment. For convenience of explanation, descriptions of substantially the same components as those described in the wafer clamping apparatus according to an embodiment will be omitted.

Referring to FIG. 13, in the wafer clamping apparatus 3 according to an embodiment, a side clamp 117 may include a first projecting portion 113*a* and a second projecting portion 113*b*.

Even when the wafer (W) is vibrated downward, in order to reduce the deformation of the wafer (W), the side clamp 117 may be further provided with the second projecting portion 113*b*.

Figure 14:
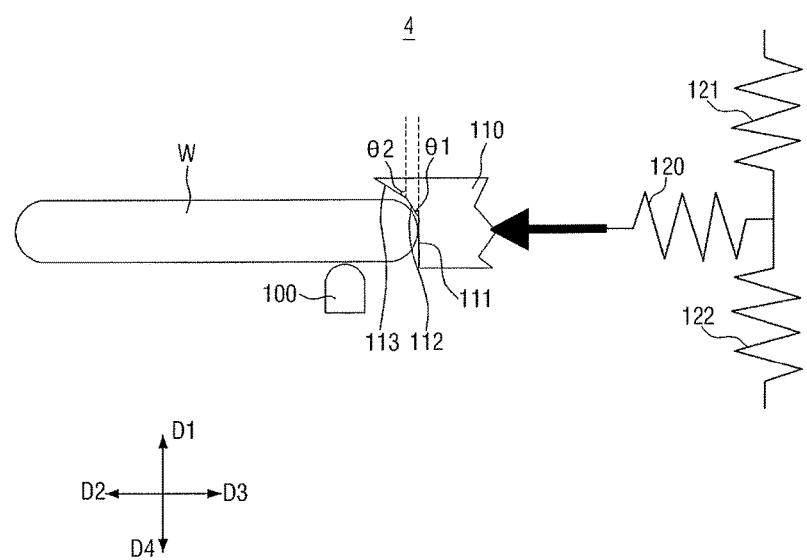
FIG. 14 illustrates a conceptual view of a wafer clamping apparatus according to an embodiment.

FIG. 14 illustrates a conceptual view of a wafer clamping apparatus according to an embodiment. For convenience of explanation, descriptions of substantially the same components as those described in the wafer clamping apparatus according to an embodiment.

Referring to FIG. 14, in the wafer clamping apparatus 4 according to an embodiment, a horizontal side clamping elastic body 120 and vertical side clamping elastic bodies 121 and 122 may be formed.

The vertical side clamping elastic bodies 121 and 122 may further be formed in order to provide a resilient restoring force even when the wafer (W) is vertically vibrated as well as when the wafer (W) is horizontally vibrated.

Figure 15:
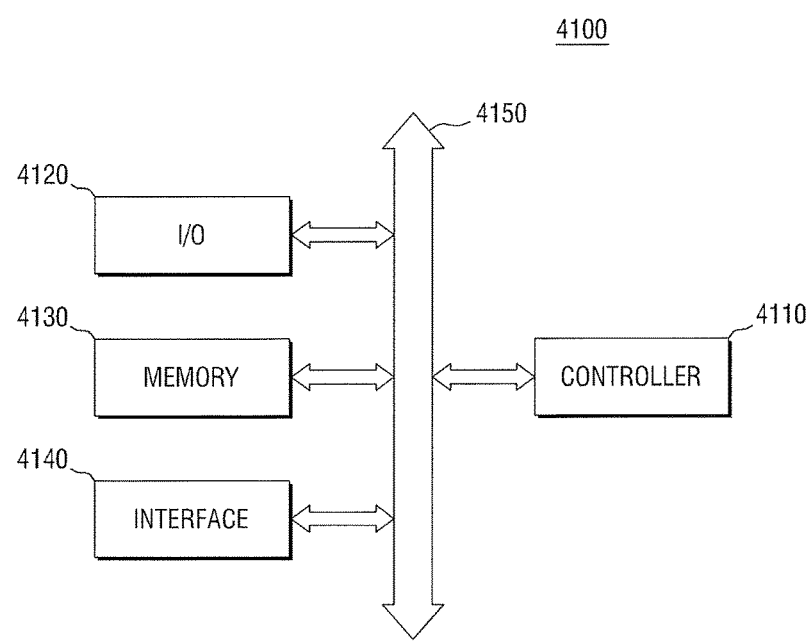
FIG. 15 illustrates a block diagram of an electronic system including semiconductor devices manufactured using the wafer clamping devices according to some embodiments.

FIG. 15 illustrates a block diagram of an electronic system including semiconductor devices manufactured using the wafer clamping devices according to some embodiments.

Referring to FIG. 15, the electronic system 4100 according to this embodiment may include a controller 4110, an input/output (I/O) device 4120, a memory device 4130, an interface 4140, and a bus 4150.

The controller 4110, the input/output device 4120, the memory device 4130, and/or the interface 4140 may be connected with each other through the bus 4150. The bus 4150 may serve as a path through which data are moved.

The controller 4110 may include at least one of a microprocessor, a digital signal processor, a microcontroller, and logic devices capable of performing functions similar to those of these devices.

The input/output device 4120 may include a keypad, a keyboard, and a display device.

The memory device 4130 may store data and/or instructions.

The interface 4140 may perform a function of transmitting data to a communication network or receiving data from the communication network. The interface 4140 may be a wired or wireless type. For example, the interface 4140 may include an antenna or a wired or wireless transceiver.

The electronic system may further include high-speed DRAM and/or SRAM as an operation memory for improving the operation of the controller 4110. The semiconductor device according to an embodiment may be provided in the memory device 4130 or may be provided as a part of, for example, the controller 4110 or the input/output device 4120.

The electronic system 4100 may be applied to personal digital assistants (PDAs), portable computers, web tablets, wireless phones, mobile phones, digital music players, memory cards, and other electronic products capable of transmitting and/or receiving information in a wireless environment.

Figure 16:
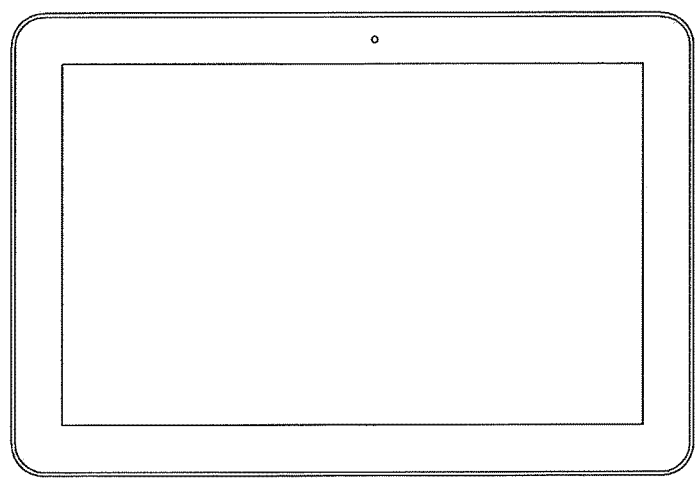
FIGS. 16 and 17 illustrate perspective views of exemplary semiconductor systems to which semiconductor devices manufactured using the wafer clamping devices according to some embodiments are applied.
Figure 17:
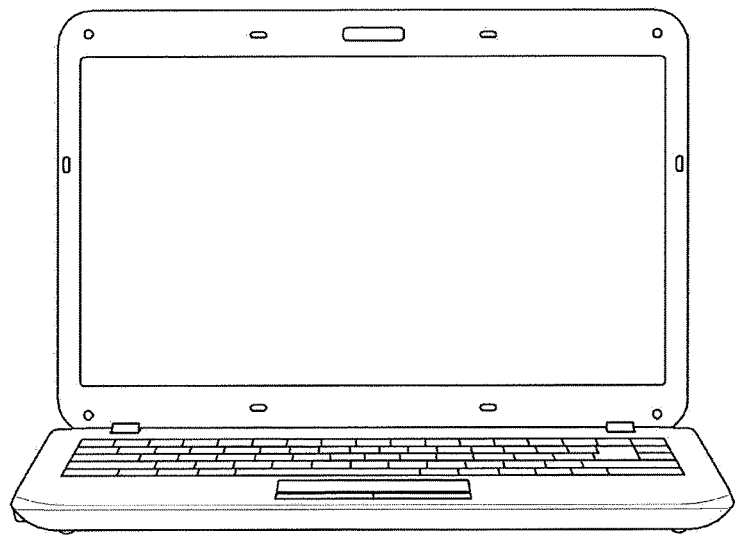

FIGS. 16 and 17 illustrate perspective views of exemplary semiconductor systems to which semiconductor devices manufactured using the wafer clamping devices according to some embodiments are applied.

FIG. 16 illustrates a tablet personal computer (PC), and FIG. 17 illustrates an electronic notebook. The semiconductor device manufactured using the extreme ultraviolet light generator according to an embodiment may be used in, for example, tablet PCs and electronic notebooks. The semiconductor device manufactured using the extreme ultraviolet light generator according to an embodiment may be applied to other integrated circuit devices.

By way of summation and review, in the process of manufacturing a semiconductor device, a wafer may be transferred to semiconductor manufacturing equipment for performing each unit process and the wafer may be appropriately fixed at the process position in the semiconductor manufacturing equipment.

Therefore, in the semiconductor manufacturing equipment, the transfer of a subject to be carried may be performed using a wafer transfer finger provided in the arm of a transfer robot. The wafer loaded by the wafer transfer finger may be supported by other additional components, and processes may be performed.

Embodiments may provide a wafer clamping apparatus including a side clamp for preventing the damage to a wafer during a high-speed heat treatment process. Embodiments may also provide a wafer clamping apparatus including a side clamp which may prevent the deformation of a wafer caused by the vibration of the wafer so as to prevent the damage of heat treatment equipment caused by the damage of the wafer during the high-speed heat treatment process.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A wafer clamping apparatus, comprising:
   a plurality of support pins under a wafer, the plurality of support pins to support the wafer; and
   a side clamp at a lateral side of the wafer, the side clamp to directly contact the lateral side of the wafer to press the wafer, the side clamp to press the wafer in a first direction or a second direction, the first direction and the second direction being different directions, wherein the side clamp includes a contact portion and a projecting portion, and wherein:
   the contact portion contacts the lateral side of the wafer, and
   the projection portion does not contact the lateral side of the wafer.

2. The wafer clamping apparatus as claimed in claim 1, further comprising a side clamping elastic body connected with the side clamp, the side clamping elastic body to provide an elastic force to the side clamp.

3. The wafer clamping apparatus as claimed in claim 1, wherein the projecting portion overlaps an upper surface of the wafer.

4. The wafer clamping apparatus as claimed in claim 3, wherein the projecting portion contacts the contact portion.

5. The wafer clamping apparatus as claimed in claim 3, wherein the side clamp further includes a connecting portion connecting the contact portion and the projecting portion.

6. The wafer clamping apparatus as claimed in claim 5, wherein:
   the connecting portion is inclined at a first angle with respect to the contact portion, and
   the projecting portion is inclined at a second angle with respect to the contact portion, the second angle being different from the first angle.

7. The wafer clamping apparatus as claimed in claim 1, wherein:
   the first direction is a direction from the side clamp to the wafer, and
   the second direction is a direction perpendicular to the first direction.

8. The wafer clamping apparatus as claimed in claim 1, wherein:
   the first direction is a vertical direction from the wafer to one of the support pins, and
   the second direction is a vertical direction opposite from the first direction.

9. The wafer clamping apparatus as claimed in claim 1, comprising a plurality of side clamps.

10. The wafer clamping apparatus as claimed in claim 9, comprising four side clamps, wherein each of the four side clamps is on an axis of a Cartesian coordinate system.

11. The wafer clamping apparatus as claimed in claim 10, wherein positions of the plurality of support pins correspond to positions of the side clamps.

12. A process equipment, comprising:
   a chamber to accommodate a wafer;
   a plate under the wafer, the plate having a shape of a plane;
   a support pin on the plate to support the wafer;
   a side clamp at a lateral side of the wafer, the side clamp to directly contact the lateral side of the wafer to press the wafer; and
   a side clamping elastic body connected with the side clamp, the side clamping elastic body to provide an elastic force to the side clamp, wherein
   the side clamp includes a contact portion and a projecting portion, and wherein:
   the contact portion contacts the lateral side of the wafer, and
   the projection portion does not contact the lateral side of the wafer.

13. The process equipment as claimed in claim 12, wherein:

the side clamp presses the wafer in a first direction or a second direction, and the first direction and the second direction are different directions.

14. A wafer clamping apparatus, comprising:
a side clamp at a lateral side of a wafer, the side clamp to directly contact the lateral side of the wafer,
a side clamping elastic body connected with the side clamp,
the side clamp and the side clamping elastic body to absorb movement energy of the wafer, wherein
the side clamp includes a contact portion and a projecting portion, and wherein:
the contact portion contacts the lateral side of the wafer, and
the projection portion does not contact the lateral side of the wafer.

15. The wafer clamping apparatus as claimed in claim 14, wherein the movement energy of the wafer results from the wafer having received high thermal energy.

16. The wafer clamping apparatus as claimed in claim 15, wherein the movement energy of the wafer is vibration in a direction of the side clamp.

17. The wafer clamping apparatus as claimed in claim 14, wherein absorption of the movement energy of the wafer prevents destruction of the wafer due to its own bending stress.

18. Process equipment, comprising the wafer clamping apparatus as claimed in claim 14, wherein absorption of the movement energy of the wafer prevents damage of the wafer due to a secondary collision with an internal structure of the process equipment.

* * * * *